(12) United States Patent
Daher et al.

(10) Patent No.: US 11,790,978 B2
(45) Date of Patent: Oct. 17, 2023

(54) REGISTER FILE WITH WRITE PRE-CHARGE

(71) Applicant: Intel Corporation, Santa Clara, CA (US)

(72) Inventors: Bassel Daher, Nazareth (IL); Ari-Shaul Leibman, Talmey Elazar (IL); George Shchupak, Zviya (IL); Or O Rotem, Haifa (IL)

(73) Assignee: Intel Corporation, Santa Clara, CA (US)

( * ) Notice: Subject to any disclaimer, the term of this patent is extended or adjusted under 35 U.S.C. 154(b) by 874 days.

(21) Appl. No.: 16/578,992

(22) Filed: Sep. 23, 2019

(65) Prior Publication Data
US 2021/0090635 A1 Mar. 25, 2021

(51) Int. Cl.
| G11C 11/4074 | (2006.01) |
| G11C 11/408 | (2006.01) |
| G11C 11/413 | (2006.01) |
| G11C 7/22 | (2006.01) |

(52) U.S. Cl.
CPC .......... *G11C 11/4085* (2013.01); *G11C 7/222* (2013.01); *G11C 11/4074* (2013.01); *G11C 11/413* (2013.01)

(58) Field of Classification Search
CPC ............ G11C 11/4074; G11C 11/4085; G11C 11/412; G11C 11/413; G11C 11/419; G11C 7/1096; G11C 7/12; G11C 7/222
USPC ...................................................... 365/233.1
See application file for complete search history.

(56) References Cited

U.S. PATENT DOCUMENTS

| 4,149,099 | A | * | 4/1979 | Nagami | ........... | H03K 3/356095 |
| | | | | | | 327/213 |
| 8,559,212 | B2 | * | 10/2013 | Huang | ..................... | G11C 7/20 |
| | | | | | | 365/154 |
| 2006/0023538 | A1 | | 2/2006 | Nishihara et al. | | |
| 2006/0203587 | A1 | | 9/2006 | Li et al. | | |
| 2009/0154265 | A1 | | 6/2009 | Kim et al. | | |
| 2010/0254209 | A1 | * | 10/2010 | Lee | ........................ | G11C 5/063 |
| | | | | | | 365/226 |
| 2012/0113722 | A1 | | 5/2012 | Aritome | | |
| 2015/0109865 | A1 | * | 4/2015 | Gulati | .................. | G11C 7/1075 |
| | | | | | | 365/189.02 |

(Continued)

OTHER PUBLICATIONS

International Search Report & Written Opinion dated Oct. 8, 2020 for PCT Patent Application No. PCT/US2020/040509.

(Continued)

*Primary Examiner* — Ly D Pham
(74) *Attorney, Agent, or Firm* — NICHOLSON DE VOS WEBSTER & ELLIOTT LLP

(57) ABSTRACT

An embodiment of a novel memory circuit is described that improves post aging performance of a shared VCC node with a write pre-charge on the supply line. A write pre-charge PMOS device is added to the shared VCC node in some embodiments. The write pre-charge circuit helps insure that the shared VCC node has a healthy voltage value at the beginning of a write phase and also enables the memory circuit to recover the shared VCC value after the write phase (e.g., immediately following), enabling a read operation after a write operation for a same register file entry or adjacent entries (e.g., entries connected to the same shared VCC node). Other embodiments are disclosed and claimed.

14 Claims, 7 Drawing Sheets

(56) References Cited

U.S. PATENT DOCUMENTS

2016/0027504 A1   1/2016   Lee

OTHER PUBLICATIONS

International Preliminary Report on Patentability from PCT/US2020/040509 dated Apr. 7, 2022, 8 pgs.

* cited by examiner

US 11,790,978 B2

REGISTER FILE WITH WRITE PRE-CHARGE

BACKGROUND

A processor may utilize a register file for local, high speed storage. Register file circuits are generally tightly coupled to the processor and coupled to the same voltage rail as the processor. In some integrated circuit devices, the register file circuits may make up a significant portion of the area of the integrated circuit device.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
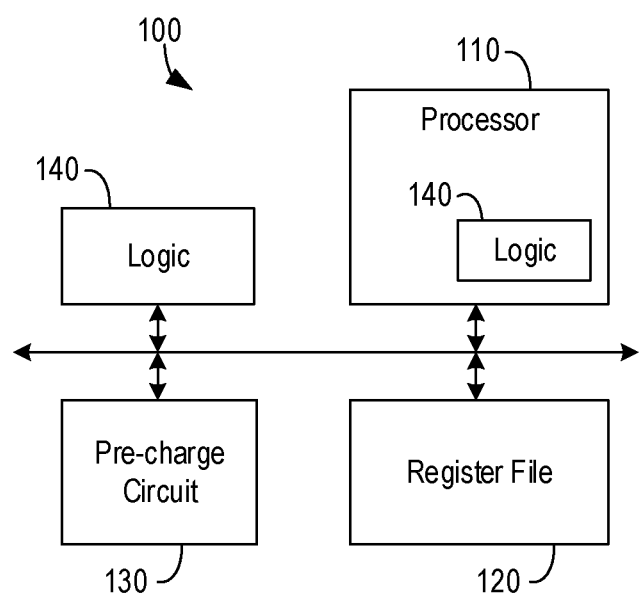
FIG. 1 illustrates a block diagram of a system including a register file with write pre-charge according to some embodiments.

Some embodiments describe a novel memory circuit that improves post aging performance of a shared VCC node with a write pre-charge on the supply line. For example, some embodiments add a write pre-charge P-type metal-oxide semiconductor (PMOS) device to the shared VCC node. The write pre-charge circuit helps insure that the shared VCC node has a healthy voltage value at the beginning of a write phase and also enables the memory circuit to recover the shared VCC value after the write phase (e.g., immediately following). Some embodiments may provide a simple and safe implementation for a write pre-charge circuit. Some embodiments may advantageously enable a read operation after a write operation (e.g., immediately following) for a same register file entry or adjacent entries (e.g., entries connected to the same shared VCC node). Some embodiments may also advantageously improve one or more of instructions per cycle (IPC) performance, soft error rate (SER) performance, and/or memory contents retention.

There are many technical effects of various embodiments. For example, circuit topology of some embodiments will allow improvement of a write contention voltage minimum (Vmin) while allowing usage of low leakage PMOS devices and saving leakage. Some embodiments exhibit a 1.6% core leakage improvement together with a 120 mv Vmin improvement. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

Here, the term "analog signal" is any continuous signal for which the time varying feature (variable) of the signal is a representation of some other time varying quantity, i.e., analogous to another time varying signal.

Here, the term "digital signal" is a physical signal that is a representation of a sequence of discrete values (a quantified discrete-time signal), for example of an arbitrary bit stream, or of a digitized (sampled and analog-to-digital converted) analog signal.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The terms "substantially," "close," "approximately," "near," and "about," generally refer to being within +/−10% of a target value.

Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are MOS transistors or their derivatives, where the MOS transistors include drain, source, gate, and bulk terminals. The transistors and/or the MOS transistor derivatives also include field effect transistors (FETs), Tri-Gate and FinFET transistors, Gate All Around Cylindrical Transistors, Tunneling FET (TFBT), Square Wire, Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFBT device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates an embodiment of a system 100 including a processor 110, a register file 120 coupled to the processor 110, a pre-charge circuit 130 coupled to the register file 120, and logic 140 coupled to the pre-charge circuit 130 to pre-charge a shared voltage supply line for a write operation to the register file 120, wherein the shared voltage supply line is separate from a bit line. As illustrated in the system 100, the logic 140 may additionally, or alternatively, be distributed throughout the system 100, with all or portions of the logic 140 integrated with the processor 110. In some embodiments, the processor 110 may be coupled to a voltage rail and the pre-charge circuit 130 may include a transmission gate coupled between the voltage rail and the shared voltage supply line (e.g., as described in more detail in connection with FIGS. 2-3). For example, the logic 140 may then be configured to clock the transmission gate to pre-charge the shared voltage supply line for the write operation to the register file 120. In some embodiments, the register file 120 may include at least two memory bit cells coupled to the shared voltage supply line (e.g., as described in more detail in connection with FIGS. 2-3) and the logic 140 may be further configured to clock the write operation to write data into one of the at least two memory bit cells of the register file. For example, the logic 140 may be further configured to clock the transmission gate and the write operation at substantially the same time.

In some embodiments, the logic 140 may be further configured to perform a read operation on the register file 120 immediately after the write operation (e.g., as used herein with respect to timing, "immediately" may refer to in the next clock cycle, in the next instruction cycle, or less than 200 ps following the write. For example, the logic may be configured to perform the read operation on a same one of the at least two memory bit cells of the register file 120 immediately following the write operation, and/or to perform the read operation on an adjacent one of the at least two memory bit cells of the register file 120 immediately following the write operation. In some conventional circuits where read after write isn't possible, for example, a logic assertion may be added to indicate that a full non-active logic clock phase is needed in place between read and write operations in order to operate correctly at low voltages. In some embodiments, the pre-charge circuit 130 may consist of a single p-type transmission gate per set of addresses coupled to a same shared voltage supply line, and/or the register file 120 may include a p-type bias circuit coupled to the same shared voltage supply line.

Some embodiments may provide technology to improve post aging performance of a shared VCC node with write pre-charge. In an integrated circuit (IC) for a central processor unit (CPU), for example, register file circuits are generally very tightly coupled to the CPU pipeline and need to remain on the same voltage rail as the rest of the CPU. Because the register file circuits may make up a large portion of the CPU area, the circuit topology and device sizing have a significant impact on the IC, particularly for low voltage applications (e.g., mobile devices). Some CPU architectures may utilize a basic one (1) read, one (1) write bit-cell in many of the integrated memory arrays (e.g., an eight (8) transistor shared PMOS bitcell topology using the smallest PMOS size).

Some ICs or SoC devices may be designed for low voltage to enable low power products. Some low voltage designs may encounter aging-related performance problems. For example, some 1-read-1-write array circuits may suffer from non-recoverable negative bias temperature instability (NBTI) aging issues on the shared-P weak shunt devices (e.g., with the smallest PMOS size). The weak Shared-P devices may not be able to hold the shared VCC value to VCC as a result of systematic and random aging variation and may not be able to match the charge drain due to memory static leakage effects.

A non-stable shared VCC node can cause one or more of the following issues: 1) bit-cell content retention issues; 2) write completion to VCC (e.g., the lack of full swing ability on bit/bitx nodes; 3) Domino read delay degradation as a result of degraded bit voltage on read port input (e.g., the arrays methodology does not allow back to back read after write, which negatively impact the needed instructions-per-cycle (IPC); and/or 4) negative soft error rate (SER) impact. The worst case scenario for memory draining shared VCC net charge is dependent on memory content polarity versus the write data polarity. The worst deterministic scenario for charge is the case of an aged shared-P shunt when the write data polarity is the opposite than the bit-cell content. In that case the shared VCC node voltage will drop and memory bit cells will lose their content.

Some other technologies to address aging performance issues may include configurable Shared-P stacks, with deferent strength, to be changed per Vmin limiter in silicon, and/or using 2 bias stacks with fuse, one bias to be used at high voltage stress and one bias to be used for low voltage. Both of these approaches have problems including: 1) area increase as a result of multi bias configurations; 2) complexity and implication of fuse logic and activation; 3) silicon tests runtime; and/or 4) they can be activated during time zero, not during lifetime. Another approach may include nominal PMOS devices usage for the bias and bit-cell devices. This approach has one or more problems including: 1) leakage increase as a result of nominal PMOS devices usage; 2) write Vmin as a result of stronger nominal PMOS device contention; 3) not safe to allow back to back read after write; 4) negative IPC impact; 5) area and power increase as a result of bypass logic implementation; and/or 6) negative SER impact.

Some embodiments advantageously overcome one or more the foregoing problems by adding a write pre-charge PMOS device to the shared VCC node. For example, a Shared-P bias/shunt circuit (e.g., smallest PMOS size) is coupled to the voltage rail/power supply to provide the shared VCC node. One or more bit cells (e.g., ×16, ×32, etc.) are coupled to the shared VCC node in a high density register file (HDRF) configuration. The added write pre-charge PMOS device insures that the shared VCC node has a healthy voltage value at the beginning of the write phase and also helps to recover the shared VCC value immediately after the write phase.

Figure 2A:
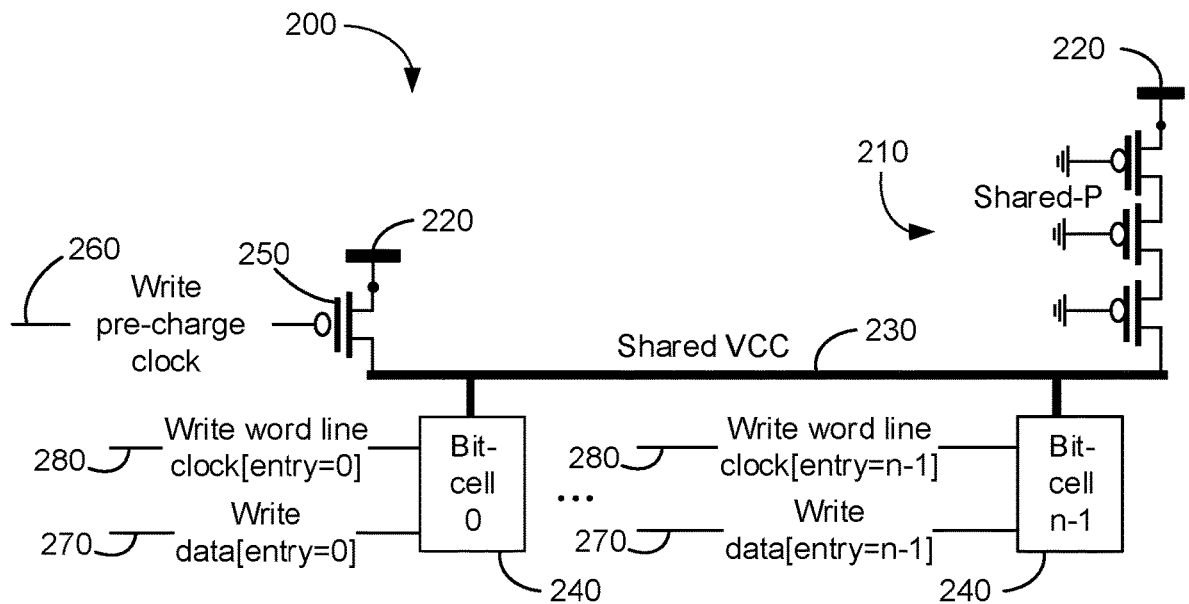
FIG. 2A illustrates a register file with write pre-charge according to some embodiments.

FIG. 2A illustrates an embodiment of a HDRF apparatus 200 including a shared shunt device 210 coupled to a voltage rail 220 to provide a shared voltage line 230, at least two memory bit cells 240 coupled to the shared voltage line 230, and a transmission gate 250 coupled between the voltage rail 220 and the shared voltage line 230. In some embodiments, the transmission gate 250 is controllable by a write pre-charge clock 260 to pre-charge the shared voltage line 230 for a write operation to one of the at least two memory bit cells 240 (e.g., bit cell 0 through bit cell n−1; where n>1). For example, the transmission gate 250 may include or consists of a p-type device, and/or the shared shunt device 210 may include or consist of two or more p-type devices (e.g., with the smallest PMOS size).

Figure 2B:
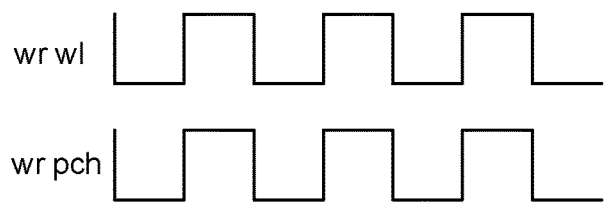
FIG. 2B illustrates a timing diagram of the write pre-charge of FIG. 2A.

FIG. 2B illustrates an embodiment of a timing diagram of the write pre-charge of FIG. 2A. For example, each of the at least two memory bit cells 240 may receive a data write signal 270 and the write operation is controllable by a write wordline clock 280. In some embodiments, the transmission gate 250 controllable by the write pre-charge clock 260 and each of the at least two memory bit cells 240 controllable by the write wordline clock(s) 280 are controllable with substantially coincident timing (e.g., respectively labeled as "wr pch" and "wr wl" in FIG. 2B).

In some embodiments, the at least two memory bit cells 240 are controllable to perform a read operation on one of the at least two memory bit cells 240 coupled to the shared voltage line immediately following a write operation on one of the at least two memory bit cells 240 coupled to the shared voltage line. For example, the at least two memory bit cells 240 are controllable to perform the read operation on a same one of the at least two memory bit cells 240 immediately following the write operation, and/or to perform the read operation on an adjacent one of the at least two memory bit cells 240 immediately following the write operation coupled to the shared voltage line 230.

Figure 3:
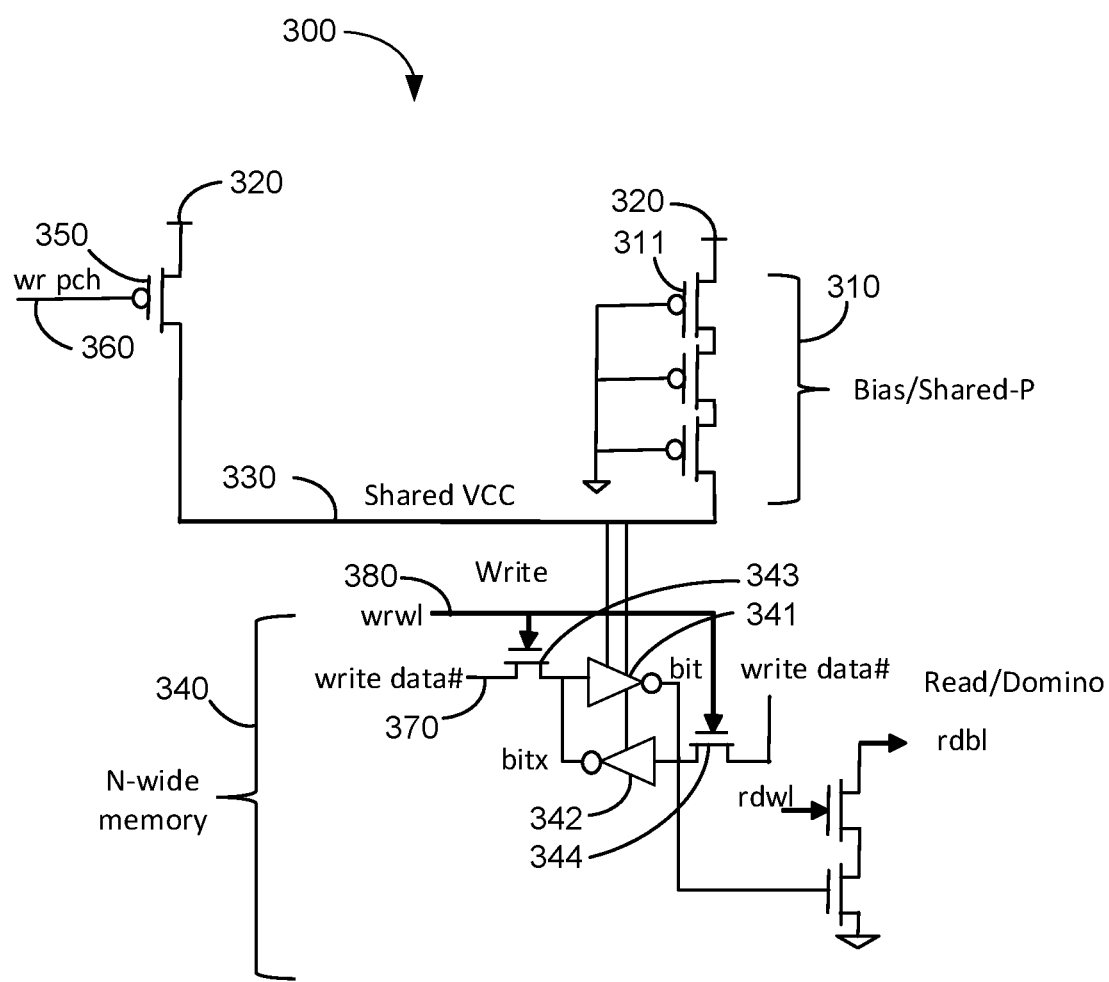
FIG. 3 illustrates another register file with write pre-charge according to some embodiments.

FIG. 3 illustrates an embodiment of a HDRF apparatus 300 including bias circuitry 310 comprising two or more p-type devices 311 coupled to a voltage rail 320 to provide a shared voltage line 330, memory circuitry 340 coupled to the shared voltage line 330 comprising a first inverter 341 and a second inverter 342 coupled in a ring with respective inputs of the first inverter 341 and second inverter 342 coupled to a data write signal 370 through respective first and second transmission gates 343, 344 which are controllable by a write clock 380, and a third transmission gate 350 comprising a p-type device coupled between the voltage rail 320 and the shared voltage line 330, where the third transmission gate 350 is controllable by a write pre-charge clock 360 to pre-charge the shared voltage line 330 for a write operation to the memory circuitry 340. In some embodiments, the third transmission gate 350 controllable by the write pre-charge clock 360 and the first and second transmission gates 343, 344 controllable by the write clock 380 are controllable with substantially coincident timing (e.g., as shown in FIG. 2B). Advantageously, the memory circuitry 340 may be controllable to perform a read operation immediately following a write operation to the memory circuitry 340.

Advantageously, some embodiments may provide a simple and safe implementation utilizing an approach similar to read pre-charge. Some embodiments may utilize the basic 1-read-1-write bit cell memory circuitry in a memory arrays (e.g., an 8 transistor shared PMOS bit cell topology with smallest PMOS size), with only one (1) additional PMOS device for the pre-charge circuit per wordline or set of addresses coupled to the same shared VCC. Advantageously, the additional gate count is very low and the pre-charge circuit adds little complexity. As noted above, some embodiments advantageously enable read after write for same entries or adjacent entries (e.g., connected to the same shared VCC node). For aging performance in particular, some embodiments advantageously improve IPC, SER and cell contents retention. Some embodiments advantageously allow improvement of write contention Vmin while allowing usage of low leakage PMOS devices and saving leakage. Some embodiments may be particularly useful for low voltage applications (e.g., between about 0.2 V to 1.5 V). For example, an example simulation result shows 1.6% core leakage improvement and 120 mv Vmin improvement.

Figure 4:
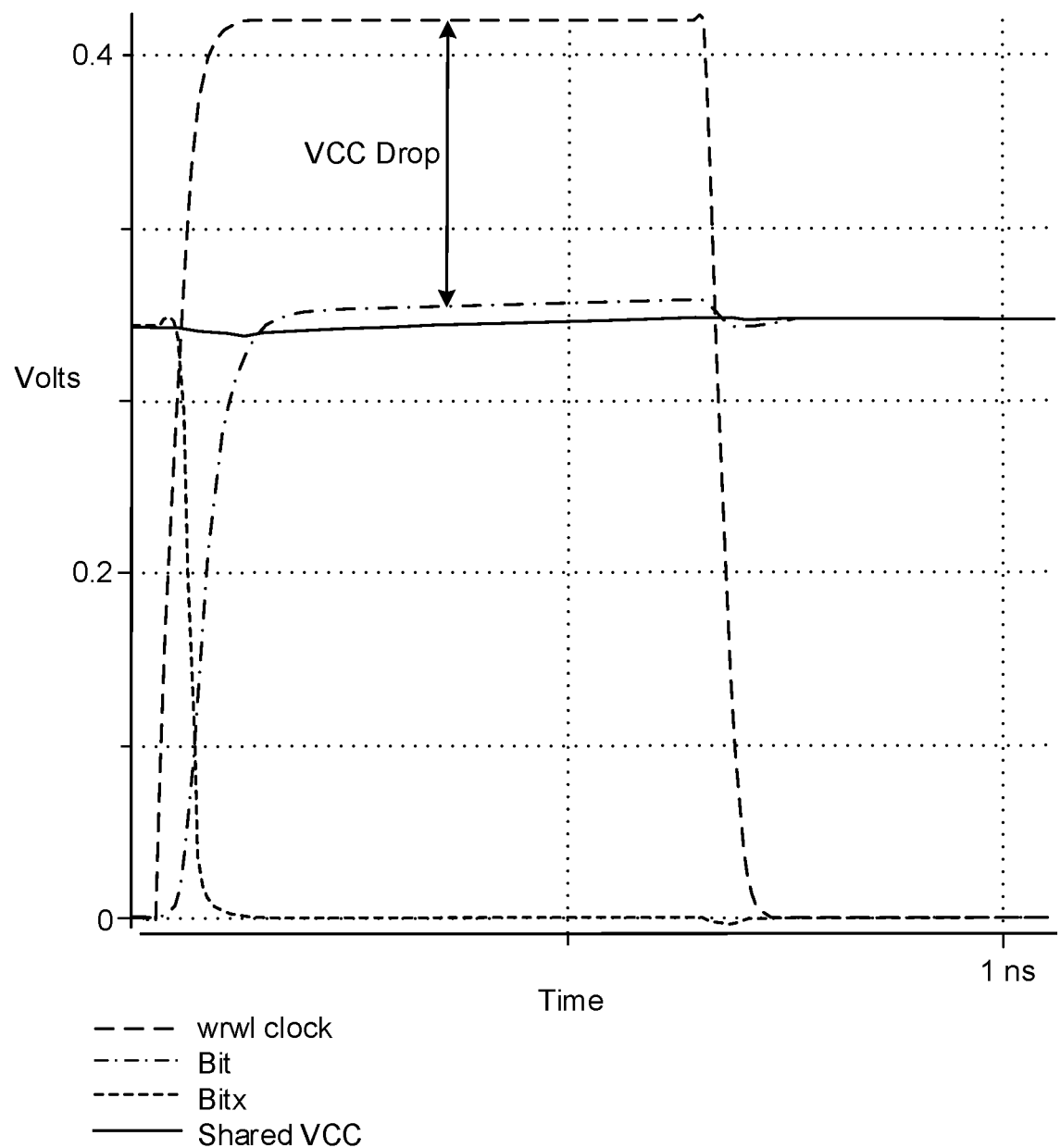
FIG. 4 illustrates a plot of write signal waveforms post variation and aging.

FIG. 4 illustrates a plot of write signal waveforms post variation and aging. A Vmin simulation was performed for typical materials and parameters at 100 degrees Celsius on a 10 nm fabrication process for mobile devices (e.g., less leakage, lower power, etc.). The simulations was preformed @ 6 Sigma (99% yield assumption) with memory initial values for the adjacent 31 bit cells set zero in order to get the maximum leakage and voltage drop on the shared VCC node. The aging conditions were simulated utilizing median DEGPAR (e.g., 99% stress for bit cell PMOS and 100% for bias devices), 1.21 v stress voltage, temp=87, 0.86 year stress time (core used conditions). FIG. 4 shows the reference bit cell nodes behavior while writing "1" to a bit-cell @ 0.52V, 800 MHz. The simulation indicates that the shared VCC node voltage drops by 160 mv due to aging.

Figure 5:
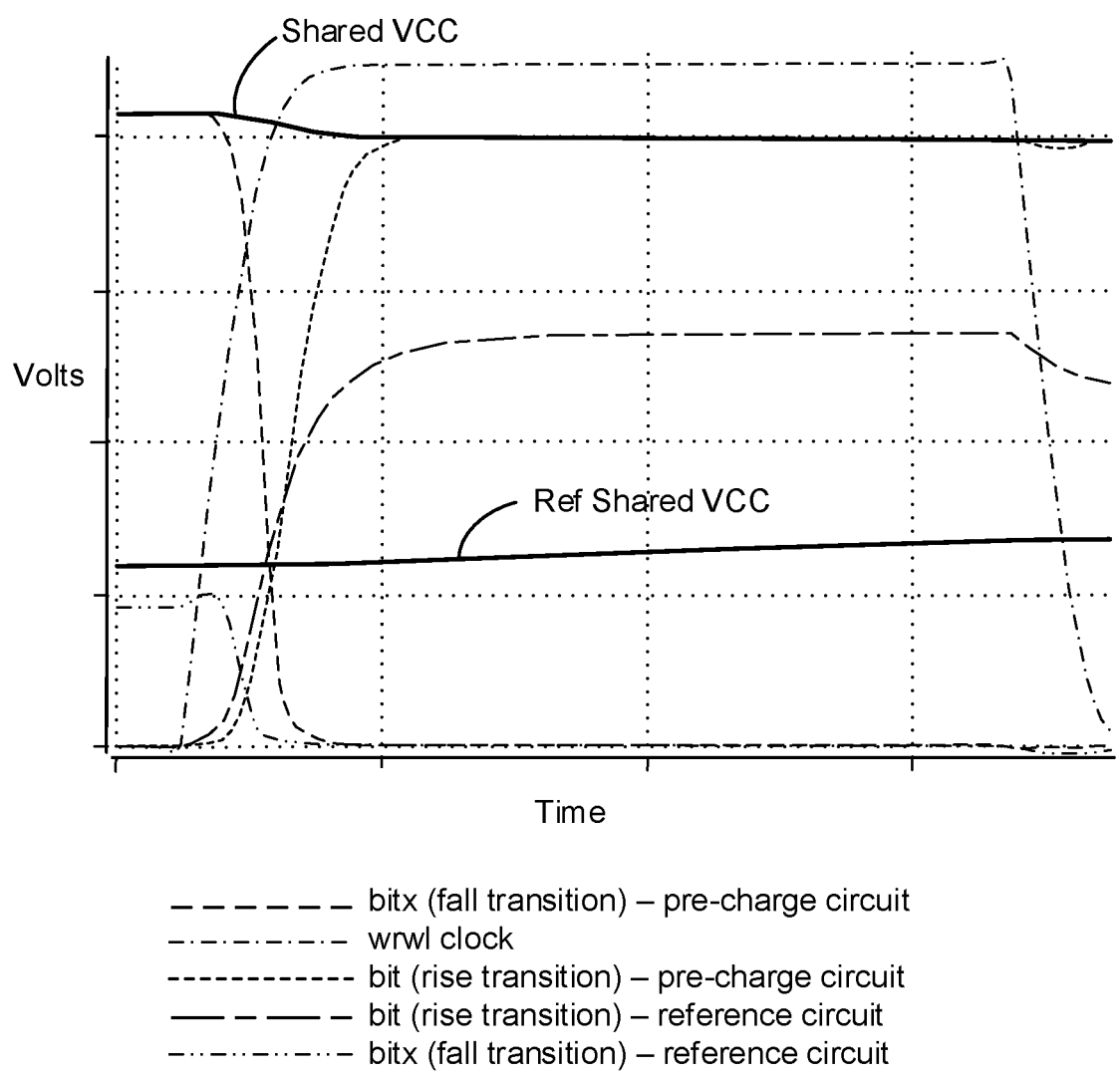
FIG. 5 illustrates a plot of a comparison of various waveforms without and with a write pre-charge according to some embodiments.

FIG. 5 illustrates a plot of a comparison of various waveforms without and with a write pre-charge according to some embodiments, showing bit-cell node behavior post variation and aging while writing a "1" to a bit-cell and reading 1 cycle after @0.42V, 800 MHz. Embodiments of a HDRF with the write pre-charge show a shared VCC node value that starts with healthy value, while the conventional HDRF shared VCC node value is far below. The example simulation result shows an about 120 mv Vmin improvement.

Figure 6:
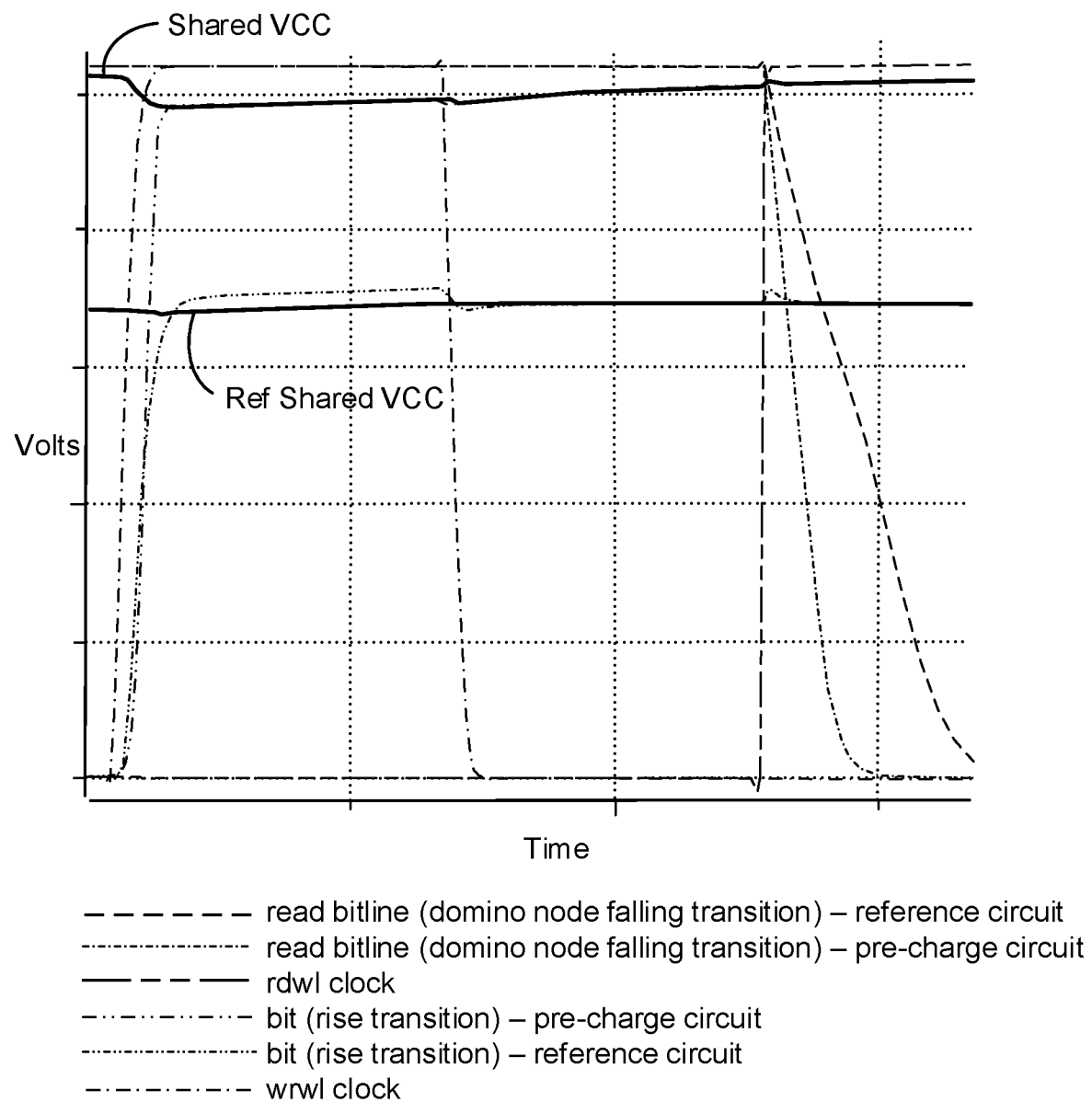
FIG. 6 illustrates a plot of various waveforms for a read phase following a write phase according to some embodiments.

FIG. 6 illustrates a plot of various waveforms for read phase immediately following a write phase according to some embodiments. The simulation results shows a read delay improvement of about 180 ps (e.g., based on about 300 ps read delay for the conventional HDRF versus an about 120 ps read delay for the HDRF with the write pre-charge). FIG. 6 also shows a comparison of bit-cell nodes voltage while writing "1" to a bit-cell and reading 1 cycle after @0.52V. The simulation result shows that the shared VCC node voltage drop difference is about 160 mv.

Given the benefit of the present specification and drawings, those skilled in the art will appreciate that embodiments of the circuits described herein may be applied to other processes and device arrangements. In a seven (7) nm process, for example, embodiments of the circuits described herein may be applied to a two-read-one-write (2r1 W) register file. Additionally, or alternatively, for a process where the PN CMOS device strength ratio is substantially changed, some embodiments may utilize a shared N device and a shared VSS node with a pre-discharge device to improve the aging characteristics of the memory circuit.

Figure 7:
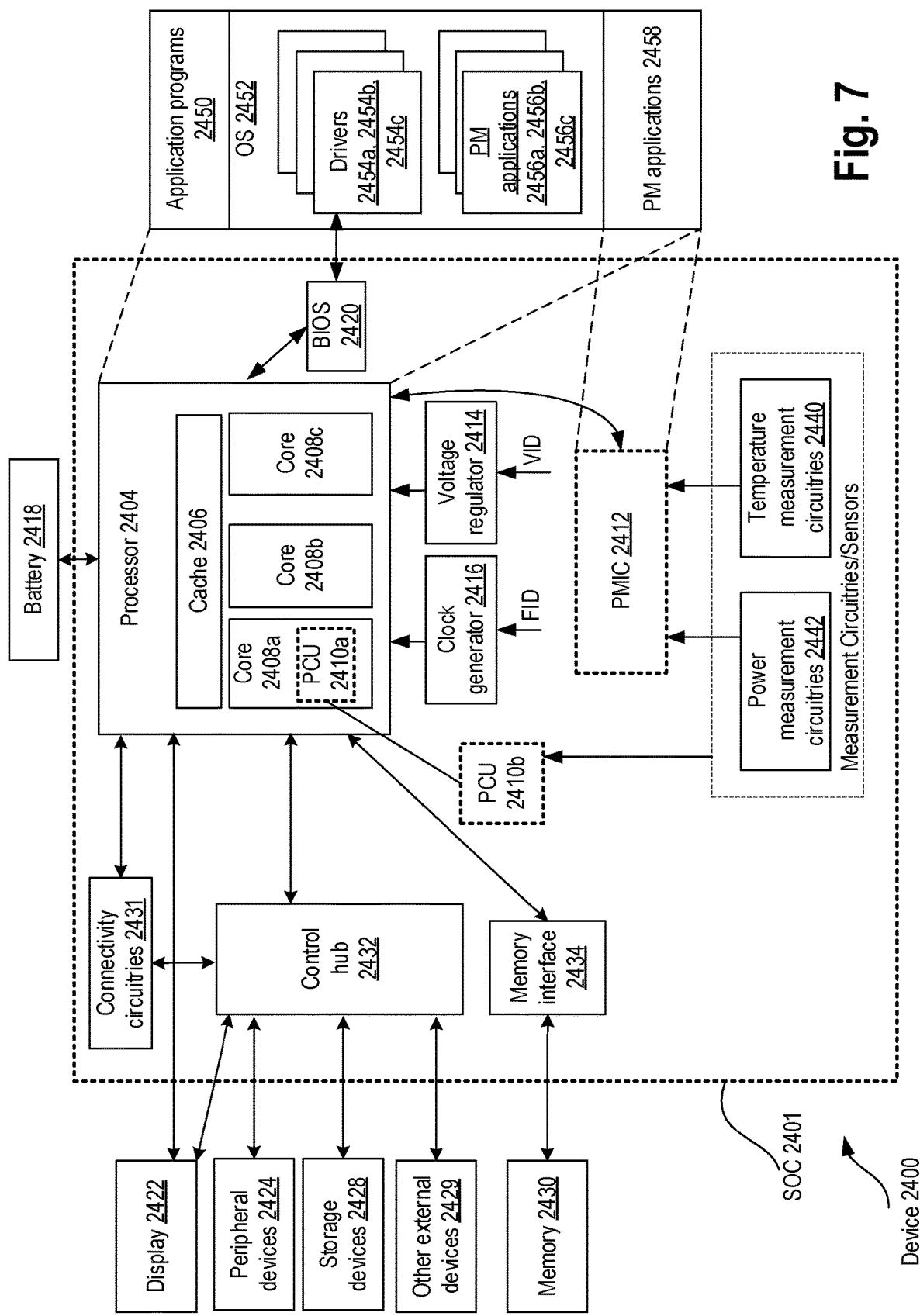
FIG. 7 illustrates a smart device, or a computer system, or a SoC (System-on-Chip) with register files with write pre-charge, according to some embodiments of the disclosure.

FIG. 7 illustrates a smart device 2400, or a computer system, or a SoC (System-on-Chip) 2401, with write pre-charge circuits for one or more integrated register files, according to some embodiments of the disclosure. Any block in the SoC 2401 discussed here can include the register files with write pre-charge of the various embodiments.

In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises a SoC (System-on-Chip) 2401. An example boundary of the SOC 2401 is illustrated using dotted lines in FIG. 7, with some example components being illustrated to be included within SOC 2401—however, SOC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408a, 2408b, 2408c. Although merely three cores 2408a, 2408b, 2408c are illustrated in FIG. 7, the processor 2404 may include any other appropriate number of processing cores, e.g., tens, or even hundreds of processing cores. Processor cores 2408a, 2408b, 2408c may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408a, a second section of cache 2406 dedicated to core 2408b, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. The processor core 2404 may also include a bus unit to enable communication between components of the processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400. Memory can include nonvolatile (state does not change if power to the memory device is interrupted) and/or volatile (state is indeterminate if power to the memory device is interrupted) memory devices. Memory device 2430 can be a dynamic random access memory (DRAM) device, a static random access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408*a*, 2408*b*, 2408*c*, voltage regulator 2414, memory 2430, a mother-board of SOC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SOC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR which is controlled by PCU 2410*a/b* and/or PMIC 2412. In some embodiments, each core has a network of distributed LDOs to provide efficient control for power management. The LDOs can be digital, analog, or a combination of digital or analog LDOs. The VR is an adaptive VR that can provide an adaptive voltage output as discussed with reference to various embodiments.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals. Clock generator 2416 is an adaptive clock source that can provide an adaptive frequency output as discussed with reference to various embodiments.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410*a*. In an example, some other sections of PCU 2410 may be implemented outside the processing cores 2408, and these sections of PCU 2410 are symbolically illustrated using a dotted box and labelled as PCU 2410*b*. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor (s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456a, 2456b, 2456c. The OS 2452 may also include various drivers 2454a, 2454b, 2454c, etc., some of which may be specific for power management purposes. In some embodiments, device 2400 may further comprise a Basic Input/Output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided to illustrate the various embodiments. These examples can depend from one another in any suitable manner.

Example 1 includes an apparatus comprising a shared shunt device coupled to a voltage rail to provide a shared voltage line, at least two memory bit cells coupled to the shared voltage line, and a transmission gate coupled between the voltage rail and the shared voltage line, wherein the transmission gate is controllable by a write pre-charge clock to pre-charge the shared voltage line for a write operation to one of the at least two memory bit cells.

Example 2 includes the apparatus of Example 1, wherein the transmission gate comprises a p-type device.

Example 3 includes the apparatus of any of Examples 1 to 2, wherein the shared shunt device comprises two or more p-type devices.

Example 4 includes the apparatus of any of Examples 1 to 3, wherein each of the at least two memory bit cells receives a data write signal and the write operation is controllable by a write wordline clock.

Example 5 includes the apparatus of Example 4, wherein the transmission gate controllable by the write pre-charge clock and each of the at least two memory bit cells controllable by the write wordline clock are controllable with substantially coincident timing.

Example 6 includes the apparatus of any of Examples 4 to 5, wherein the at least two memory bit cells are controllable to perform a read operation on one of the at least two memory bit cells coupled to the shared voltage line following a write operation on one of the at least two memory bit cells coupled to the shared voltage line (e.g., immediately following).

Example 7 includes the apparatus of Example 6, wherein the at least two memory bit cells are controllable to perform the read operation on a same one of the at least two memory bit cells following the write operation (e.g., immediately following).

Example 8 includes the apparatus of any of Examples 6 to 7, wherein the at least two memory bit cells are controllable to perform the read operation on an adjacent one of the at least two memory bit cells following the write operation coupled to the shared voltage line (e.g., immediately following).

Example 9 includes an apparatus comprising bias circuitry comprising two or more p-type devices coupled to a voltage rail to provide a shared voltage line, memory circuitry coupled to the shared voltage line comprising a first inverter and a second inverter coupled in a ring with respective inputs of the first inverter and the second inverter coupled to a data write signal through respective first and second transmission gates which are controllable by a write clock, and a third transmission gate comprising a p-type device coupled between the voltage rail and the shared voltage line, wherein the third transmission gate is controllable by a write pre-charge clock to pre-charge the shared voltage line for a write operation to the memory circuitry.

Example 10 includes the apparatus of Example 9, wherein the third transmission gate controllable by the write pre-charge clock and the first and second transmission gates controllable by the write clock are controllable with substantially coincident timing.

Example 11 includes the apparatus of any of Examples 9 to 10, wherein the memory circuitry is controllable to perform a read operation following a write operation to the memory circuitry (e.g., immediately following).

Example 12 includes a system comprising a processor, a register file coupled to the processor, a pre-charge circuit coupled to the register file, and logic coupled to the pre-charge circuit to pre-charge a shared voltage supply line for a write operation to the register file, wherein the shared voltage supply line is separate from a bit line.

Example 13 includes the system of Example 12, wherein the processor is coupled to a voltage rail and the pre-charge circuit comprises a transmission gate coupled between the voltage rail and the shared voltage supply line, and wherein the logic is further to clock the transmission gate to pre-charge the shared voltage supply line for the write operation to the register file.

Example 14 includes the system of any of Examples 12 to 13, wherein the register file comprises at least two memory bit cells coupled to the shared voltage supply line, and wherein the logic is further to clock the write operation to write data into one of the at least two memory bit cells of the register file.

Example 15 includes the system of any of Examples 13 to 14, wherein the logic is further to clock the transmission gate and the write operation at substantially the same time.

Example 16 includes the system of Example 15, wherein the logic is further to perform a read operation on the register file after the write operation (e.g., immediately following).

Example 17 includes the system of Example 16, wherein the logic is further to perform the read operation on a same one of the at least two memory bit cells of the register file following the write operation (e.g., immediately following).

Example 18 includes the system of any of Examples 16 to 17, wherein the logic is further to perform the read operation on an adjacent one of the at least two memory bit cells of the register file following the write operation (e.g., immediately following).

Example 19 includes the system of any of Examples 13 to 18, wherein the pre-charge circuit consists of a single p-type transmission gate per set of addresses coupled to a same shared voltage supply line.

Example 20 includes the system of any of Examples 13 to 19, wherein the register file comprises a p-type bias circuit coupled to the same shared voltage supply line.

Example 21 includes a method, comprising storing data in a register file, and pre-charging a shared voltage line for a write operation to a register file.

Example 22 includes the method of Example 21, further comprising clocking a transmission gate to pre-charge the shared voltage line for the write operation to the register file.

Example 23 includes the method of any of Examples 21 to 22, further comprising clocking the write operation to write data into one of at least two memory bit cells of the register file.

Example 24 includes the method of any of Examples 22 to 23, further comprising clocking the transmission gate and the write operation at substantially the same time.

Example 25 includes the method of any of Examples 21 to 24, further comprising performing a read operation on the register file after the write operation (e.g., immediately following).

Example 26 includes the method of Example 25, further comprising perform the read operation on a same one of the at least two memory bit cells of the register file following the write operation (e.g., immediately following).

Example 27 includes the method of any of Examples 25 to 26, further comprising perform the read operation on an adjacent one of the at least two memory bit cells of the register file following the write operation (e.g., immediately following).

Example 28 includes a register file apparatus, comprising means for storing data in a register file, and means for pre-charging a shared voltage line for a write operation to a register file.

Example 29 includes the method of Example 28, further comprising means for clocking a transmission gate to pre-charge the shared voltage line for the write operation to the register file.

Example 30 includes the method of any of Examples 28 to 29, further comprising means for clocking the write operation to write data into one of at least two memory bit cells of the register file.

Example 31 includes the method of any of Examples 29 to 30, further comprising means for clocking the transmission gate and the write operation at substantially the same time.

Example 32 includes the method of any of Examples 28 to 31, further comprising means for performing a read operation on the register file after the write operation (e.g., immediately following).

Example 33 includes the method of Example 32, further comprising means for perform the read operation on a same one of the at least two memory bit cells of the register file following the write operation (e.g., immediately following).

Example 34 includes the method of any of Examples 32 to 33, further comprising means for perform the read operation on an adjacent one of the at least two memory bit cells of the register file following the write operation (e.g., immediately following).

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. An apparatus comprising:
   a shared shunt device coupled to a voltage rail to provide a shared voltage line;
   at least two memory bit cells coupled to the shared voltage line; and
   a transmission gate coupled between the voltage rail and the shared voltage line, wherein the transmission gate is controlled by a write pre-charge clock to pre-charge the shared voltage line for a write operation to one of the at least two memory bit cells while the shunt device is providing the shared voltage line.

2. The apparatus of claim 1, wherein the transmission gate comprises a p-type device.

3. The apparatus of claim 1, wherein the shared shunt device comprises two or more p-type devices.

4. The apparatus of claim 1, wherein each of the at least two memory bit cells receives a data write signal and the write operation is controllable by a write wordline clock.

5. The apparatus of claim 4, wherein the transmission gate controllable by the write pre-charge clock and each of the at least two memory bit cells controllable by the write wordline clock are controllable with substantially coincident timing.

6. The apparatus of claim 4, wherein the at least two memory bit cells are controllable to perform a read operation on one of the at least two memory bit cells coupled to the shared voltage line following a write operation on one of the at least two memory bit cells coupled to the shared voltage line.

7. The apparatus of claim 6, wherein the at least two memory bit cells are controllable to perform the read operation on a same one of the at least two memory bit cells following the write operation.

8. The apparatus of claim 6, wherein the at least two memory bit cells are controllable to perform the read operation on an adjacent one of the at least two memory bit cells following the write operation coupled to the shared voltage line.

9. An apparatus comprising:
   bias circuitry comprising two or more p-type devices coupled to a voltage rail to provide a shared voltage line;
   memory circuitry coupled to the shared voltage line comprising a first inverter and a second inverter coupled in a ring with respective inputs of the first inverter and the second inverter coupled to a data write signal through respective first and second transmission gates which are controllable by a write clock; and
   a third transmission gate comprising a p-type device coupled between the voltage rail and the shared voltage line, wherein the third transmission gate is controllable by a write pre-charge clock to pre-charge the shared voltage line for a write operation to the memory circuitry.

10. The apparatus of claim 9, wherein the third transmission gate controllable by the write pre-charge clock and the first and second transmission gates controllable by the write clock are controllable with substantially coincident timing.

11. The apparatus of claim 9, wherein the memory circuitry is controllable to perform a read operation following a write operation to the memory circuitry.

12. The apparatus of claim 11, wherein the memory circuitry includes at least two memory bit cells that are controllable to perform the read operation on one of the at least two memory bit cells coupled to the shared voltage line following the write operation on one of the at least two memory bit cells coupled to the shared voltage line.

13. The apparatus of claim 12, wherein the at least two memory bit cells are controllable to perform the read operation on a same one of the at least two memory bit cells following the write operation.

14. The apparatus of claim 12, wherein the at least two memory bit cells are controllable to perform the read operation on an adjacent one of the at least two memory bit cells following the write operation coupled to the shared voltage line.

* * * * *